United States Patent
Withers

(10) Patent No.: US 7,446,534 B2
(45) Date of Patent: Nov. 4, 2008

(54) COLD NORMAL METAL AND HTS NMR PROBE COILS WITH ELECTRIC FIELD SHIELDS

(75) Inventor: Richard S. Withers, Sunnyvale, CA (US)

(73) Assignee: Varian, Inc., Palo Alto, CA (US)

(*) Notice: Subject to any disclaimer, the term of this patent is extended or adjusted under 35 U.S.C. 154(b) by 0 days.

(21) Appl. No.: 11/643,152

(22) Filed: Dec. 20, 2006

(65) Prior Publication Data

US 2008/0150536 A1    Jun. 26, 2008

(51) Int. Cl.
 *G01V 3/00* (2006.01)
(52) U.S. Cl. ................... 324/322; 324/318
(58) Field of Classification Search .......... 324/322, 324/319, 318
See application file for complete search history.

(56) References Cited

U.S. PATENT DOCUMENTS

| | | | |
|---|---|---|---|
| 4,633,181 A * | 12/1986 | Murphy-Boesch et al. | .. 324/322 |
| 4,785,246 A | 11/1988 | Sugimoto | |
| 5,192,911 A | 3/1993 | Hill et al. | |
| 5,262,727 A | 11/1993 | Behbin et al. | |
| 5,565,778 A | 10/1996 | Brey et al. | |
| 5,594,342 A | 1/1997 | Brey et al. | |
| 5,619,140 A | 4/1997 | Brey et al. | |
| 6,054,856 A | 4/2000 | Garroway et al. | |
| 6,498,487 B1 | 12/2002 | Haner | |
| 2002/0140425 A1 * | 10/2002 | Prammer et al. | ............ 324/303 |
| 2005/0146331 A1 | 7/2005 | Flexman et al. | |

OTHER PUBLICATIONS

Article by Hoult, DI, entitled "The Sensitivity of the Zeugmatographic Experiment Involving Human Samples", published by Journal of Magnetic Resonance, 34, pp. 425-433, (1979).
Article by Gadian, et al., entitled "Radiofrequency Losses in NMR Experiments on Electrically Conducting Samples", published by Journal of Magnetic Resonance, 34, pp. 449-455, (1979).
Article by Alderman, et al., entitled "An Efficient Decoupler Coil Design which Reduces Heating in Conductive Samples in Superconducting Spectrometers", published by Journal of Magnetic Resonance, 36, pp. 447-451. (1979).
PCT/US2007/025564, International Search Report, mailed Apr. 14, 2008, 3 pp.

* cited by examiner

*Primary Examiner*—Louis M Arana
(74) *Attorney, Agent, or Firm*—Bella Fishman

(57) ABSTRACT

RF electric fields produced by electric potential differences in the NMR probe coil windings may penetrate the NMR sample and sample tube causing sensitivity loss and increased noise in NMR spectroscopy. Electrically conducting strips in close proximity to the windings of the NMR probe coil and oriented at right angles to direction of the coil winding they cross provide an alternative path for these electric fields while causing negligible effect upon the RF magnetic field, thereby increasing the sensitivity of the NMR probe.

10 Claims, 4 Drawing Sheets

COLD NORMAL METAL AND HTS NMR PROBE COILS WITH ELECTRIC FIELD SHIELDS

FIELD OF THE INVENTION

This invention relates to nuclear magnetic resonance (NMR) technology utilizing cryogenic NMR probes that employ cryogenic probe coils, and in particular those utilizing high-temperature-superconducting (HTS) materials.

BACKGROUND OF THE INVENTION

NMR is a powerful technique for analyzing molecular structure. However it is also an insensitive technique compared to other techniques for structure determination. To gain maximum sensitivity, NMR magnets and spectrometers are designed to operate at high magnetic field strengths, employ low noise preamplifiers and RF probe coils that operate at cryogenic temperatures using cold normal metal transmit/receive coils or preferably transmit/receive coils made with HTS materials. The transmit/receive coils are the probe coils that stimulate the nuclei and detect the NMR response from the sample, and therefore are placed very close to the sample to provide high sensitivity. The HTS coils have the highest quality factor, Q, and yield the best sensitivity. For the multi-turn spiral coils used to detect the lower gamma nuclei such as $^{13}C$, $^{15}N$ and $^{31}P$, electric fields from turns of the spiral coils near the sample may penetrate the sample and cause dielectric losses and increased noise. The electric fields penetrating the sample also cause detuning of the coil and a resonant frequency that is a function of the sample position. In spinning samples, this detuning can lead to spurious spinning sidebands.

SUMMARY OF THE INVENTION

The present invention pertains to the use of cold metal or HTS shields placed in regions where the coil is in closest proximity to the sample. RF electric fields arise from potential differences between adjacent and nearby turns of the HTS coil. The present invention reduces or avoids this problem by shielding the sample from these electric fields, while having a minimum effect upon the RF magnetic fields that stimulate the NMR response. The shields provide an alternative path for the electric field lines, a path that does not intersect the sample volume.

BRIEF DESCRIPTION OF THE DRAWINGS

The forgoing aspects and advantages of the present invention will become better understood by reference to the following detailed description when taken in conjunction with the accompanying drawings.

LIST OF THE ELEMENTS SHOWN IN FIGS. 1-7

Figure 1:
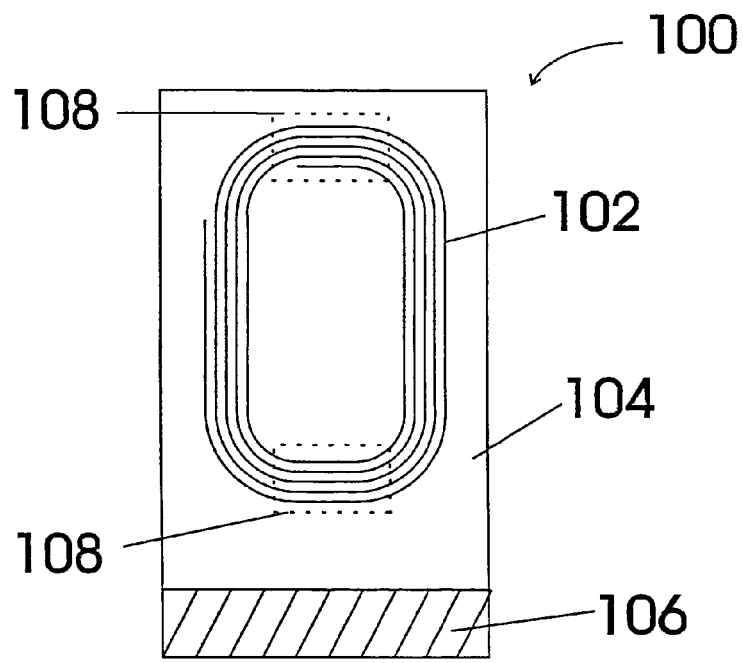
FIG. 1 shows a HTS NMR probe coil assembly in accordance with the prior art.

| | |
|---|---|
| 100 | probe coil assembly |
| 102 | coil winding |
| 104 | planar substrate |
| 106 | heat exchange region |
| 108 | dotted box |
| 120 | electric field shield assembly |
| 123 | shield strips |
| 124 | dielectric substrate |
| 125 | heat exchange region |
| 140 | cryogenically cooled probe |
| 141 | sample tube |
| 142 | NMR sample |
| 143 | heat exchanger |
| 144 | outer shell |
| 145 | inner tube |
| 146 | vacuum tight space |
| 147 | cold gas source |
| 148 | cold gas transfer tubes |
| 149 | preamplifier and T/R switch |
| 150 | RF probe cable |
| 151 | RF spectrometer cable |
| 152 | Additional HTS coil assembly |
| 153 | RF transmit cable |
| 160 | complete electric field shield assembly |
| 162 | shield strips |
| 164 | planar substrate |
| 180 | cryogenically cooled probe assembly |
| 181 | cylindrical tube |
| 182 | saddle coil winding |
| 183 | bonding pads |
| 184 | electric field shield |
| 186 | bracket |
| 187 | vertical member |
| 188 | horizontal member |

DETAILED DESCRIPTION OF THE INVENTION

An NMR probe coil provides the RF magnetic field to the sample, thereby stimulating the nuclear spins, and detects the response of the nuclear spins.

When the RF current flows through the windings of the NMR probe coil, an RF magnetic field is produced at the sample. An RF transmit current produced in the coil produces the RF magnetic field that stimulates the resonance in the sample. This RF magnetic field, B, has an associated RF electric field, E. This RF electric field, E, can be calculated utilizing the Maxwell equation curl E=−dB/dt. To minimize losses from this RF electric field, NMR probes are designed so that the sample is in a region where this RF electric field is a minimum, or passes through zero.

There is another component of electric field that is caused by the electric potential between the windings of an RF coil. This so called conservative electric field arises from the electric potential differences of the turns of the RF coil winding. This component of electric field, Ec, obeys the condition curl Ec=0. It is sometimes called an electrostatic field since it does not require any time derivatives to produce it. When this component of electric field penetrates the sample or sample tube it can cause energy losses. During transmit and during spin decoupling experiments these losses can cause undesired heating of the sample. During the receive phase, the currents induced by the NMR signal also produce an electric potential between turns of the RF probe coil causing electric fields penetrating the sample volume resulting in a loss of Q and reduced sensitivity. Since the sample is usually at or near room temperature and the probe coil is at a very low temperature, noise power is also introduced into the RF probe coil through this electric field coupling. This loss is proportional to the electric field coupling between the sample and the RF probe coil and depends upon the dielectric loss tangent or dissipation factor of the sample and sample tube material and the electrical conductivity of ionic samples.

The described embodiments minimize these losses by eliminating or minimizing the conservative electric field component penetrating the NMR sample and sample tube. An electric field shield minimizes this component of electric field by providing an alternative preferred path for the electric field components. The electric field shield of this invention is comprised of a series of electrically conductive strips that are arranged near the windings of the RF probe coil and oriented perpendicular to the windings of the coil. These strips provide an alternate path for the RF electric field components arising from the potential differences between adjacent and nearby turns of the probe coil. The strips have a negligible effect upon the RF magnetic field that penetrates the sample. A secondary advantage of this invention is that the frequency shifts introduced by the dielectric constant of the sample are reduced, which is important if the sample is spinning. The invention is illustrated below with shield designs appropriate to HTS probe coils and cooled normal metal probe coils.

The embodiments are described for cryogenic probes, i.e. probes wherein the RF probe coil that provides the RF magnetic field to the sample and receives the responsive RF field produced by the sample, is cooled to a cryogenic temperature. For present day superconductors this is necessary as they loose their superconducting properties at temperatures near room temperature. In the future it may happen that HTS materials will be discovered that will operate near room temperature. It is intended that the invention includes non-cryogenic coils, those made of normal metals as well as superconducting materials.

FIG. 1 depicts a prior art HTS NMR probe coil assembly 100 that provides the RF field to the sample thereby stimulating the nuclear spins and then receiving the response of the nuclear spins in the sample. Typically the coil winding 102 is composed of a high temperature superconducting (HTS) material such as yttrium barium copper oxide (YBCO). The HTS material may be sputtered, evaporated, or otherwise deposited upon an electrically insulating planar substrate 104 such as sapphire. In an NMR probe two probe coil assemblies are used, one on each side of the sample tube. Each substrate is attached to the heat exchanger in region 106 of the planar substrate. The heat exchanger (143 shown in FIG. 4) provides the cooling and temperature control of probe coil assemblies 100. A coupling loop (not shown) magnetically coupled to the coil windings and electrically connected to the NMR spectrometer supplies the RF energy to excite NMR resonance and it receives the response induced into the coil from the sample material and transmits it to the spectrometer for processing, recording and display.

In a HTS NMR probe the sample tube is typically a cylindrical tube with the long axis of the tube parallel to each face of the planar substrates 104. The sample tube passes very close to the coil windings 102 in the regions indicated by the doted boxes 108. In this region the potential differences between adjacent and nearby windings produce electric fields that penetrate the nearby sample tube and NMR sample causing loss. Placing the electric field shield strips (123 in FIG. 2) in this sensitive region, either between the coil winding 102 and the sample tube, or even on the side opposite the sample tube adjacent to the coil winding 102 will reduce or eliminate the conservative electric fields penetrating the NMR sample and sample tube.

Figure 2:
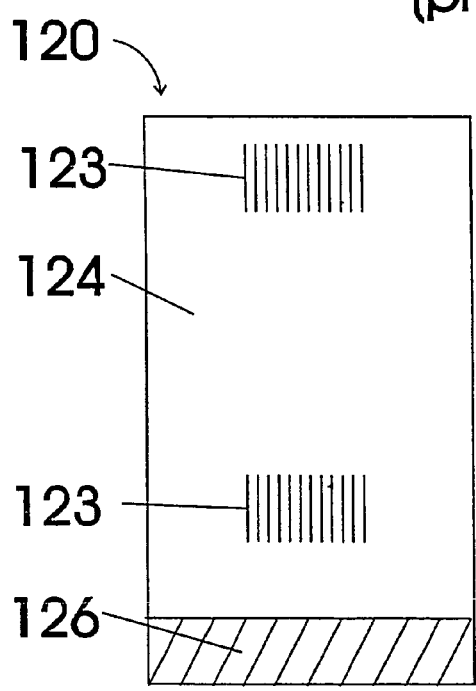
FIG. 2 shows a RF electric field shield that covers the critical areas of the NMR probe coil assembly in accordance with the present invention.
Figure 3:
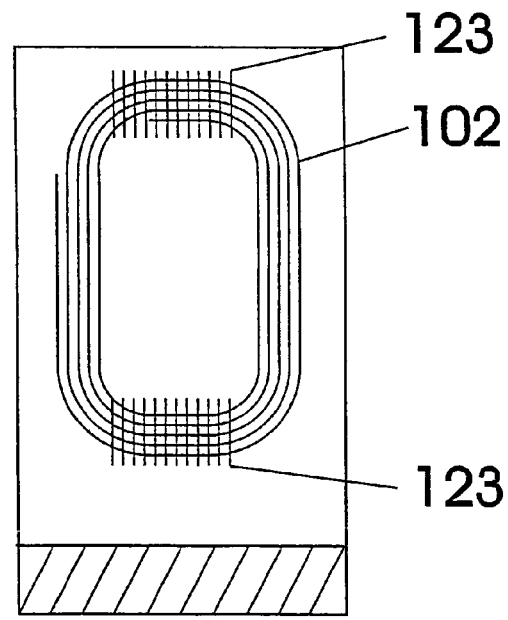
FIG. 3 is a view showing the spatial relationship of the NMR probe coil winding and the shield.

FIG. 2 depicts an electric field shield assembly 120 in accordance with this invention. It comprises a series of shield strips 123 of HTS material deposited on a planar dielectric substrate 124. The shield is designed to be thermally coupled to a heat exchanger in region 126. Shield assembly 120 is mounted adjacent to probe coil assembly 100 as indicated in FIG. 3. The dielectric substrate of either assembly 100 or 120 or both, or an alternative non-conductor, insulate the shield conductors from the windings. Alternatively shield strips 123 may be deposited on the same substrate as the HTS windings, but on the opposite side of the substrate.

Figure 4:
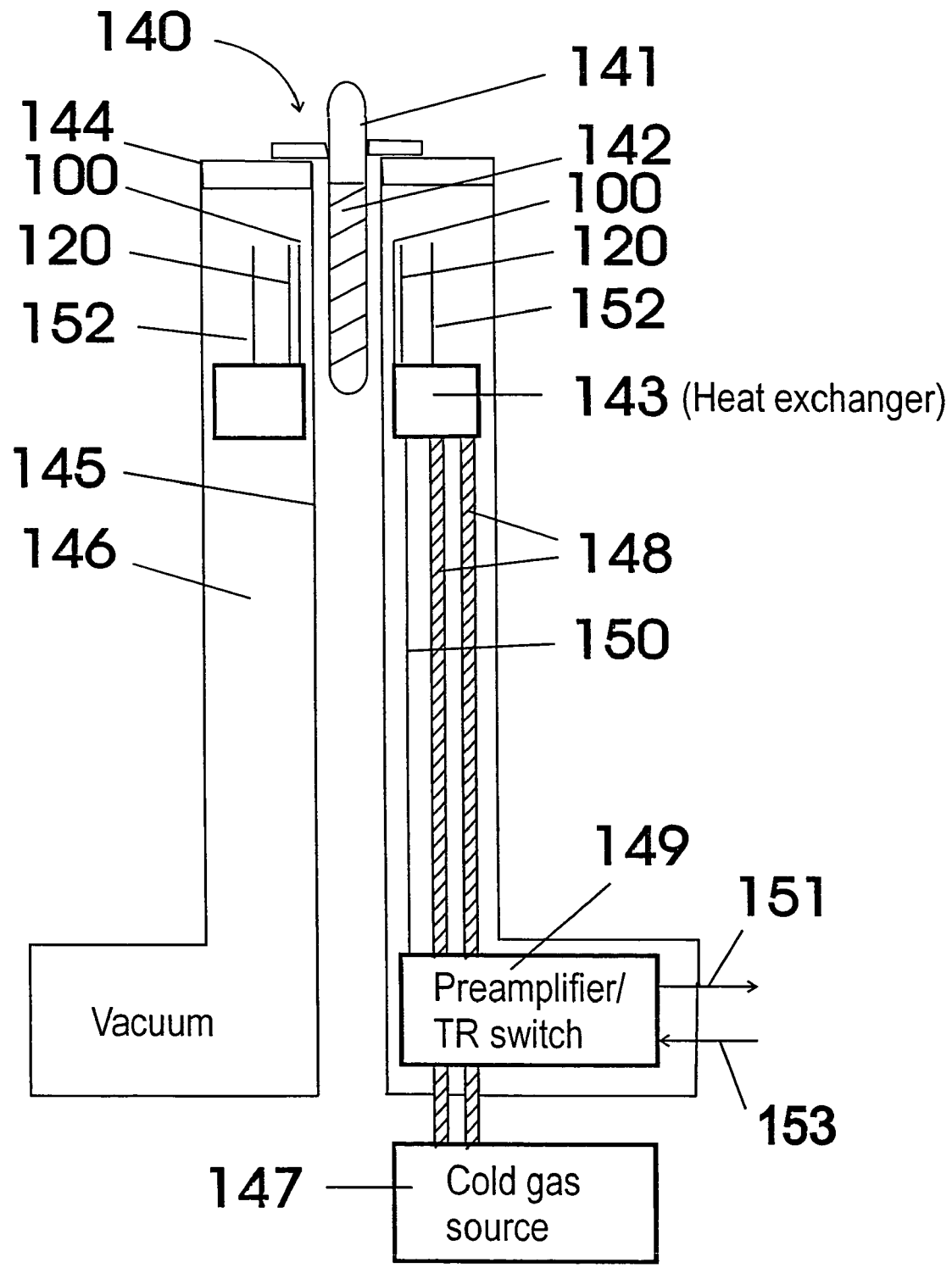
FIG. 4 is a block diagram depicting a cryogenically cooled NMR probe utilizing HTS probe coil assembly and associated electric field shield assembly.

FIG. 4 is a block diagram of a cryogenically cooled probe 140 with sample tube 141 and NMR sample 142. The probe 140 has an outer shell 144 made of non-ferromagnetic material such as aluminum and an inner dielectric tube 145 made of fused quartz, for example. The outer shell 144 and dielectric inner tube 145 form a vacuum tight space 146. This space is evacuated providing good thermal insulation of the cold coil assembly 100 and shield assemblies 120 from the warm sample and sample tube. An RF probe coil assembly 100 is mounted on each side of sample tube 141, and each is in thermal contact with heat exchanger 143. Heat exchanger 143 surrounds inner tube 145 thereby providing cooling to the coil assemblies on both sides of sample tube 141. Cooling for the RF probe coil assembly and electric field shield assembly is provided by cold gas source 147. The HTS probe coil assemblies 100 and electric field shield assemblies 120 are typically cooled to a temperature in the range of 20 K. The cold gas flows to and from heat exchanger 143 by cold gas transfer tubes 148. The tube supplying the cold gas from cold gas source 147 is thermally insulated from the preamplifier and T/R (Transmit/Receive) switch 149, while the tube returning the partially spend gas is in thermal contact with the preamplifier and T/R switch 149, thereby cooling it to a low temperature typically in the range of 80 K. Alternatively two cold gas coupling loops may be used, one to cool the RF coil assemblies, 100, 120 and 152, and one to cool the preamplifier and T/R switch 149.

On each side of the sample tube 141 a shield assembly 120 is mounted adjacent to probe coil assembly 100. Although the diagram shows shield assembly 120 on the opposite side of probe coil assembly 100 from sample tube 141, alternatively it could be placed between the sample tube and probe coil assembly 100. As described above, alternatively the coil winding and shield strips 123 could be deposited on the same substrate with either side oriented toward the sample.

An RF probe cable 150 transmits RF power to the coil winding 102 and NMR response signals to the preamplifier and T/R switch 149. The preamplifier and T/R switch receive transmit power from the spectrometer (not shown) vis cable 153 and send the amplified NMR signal to the spectrometer (not shown) on cable 151.

Additional HTS coil assemblies 152, with possible electric field shields associated with them, provide multinuclear capability. Additional cables may be used to transmit signals from the spectrometer to the additional coil assemblies.

Figure 5:
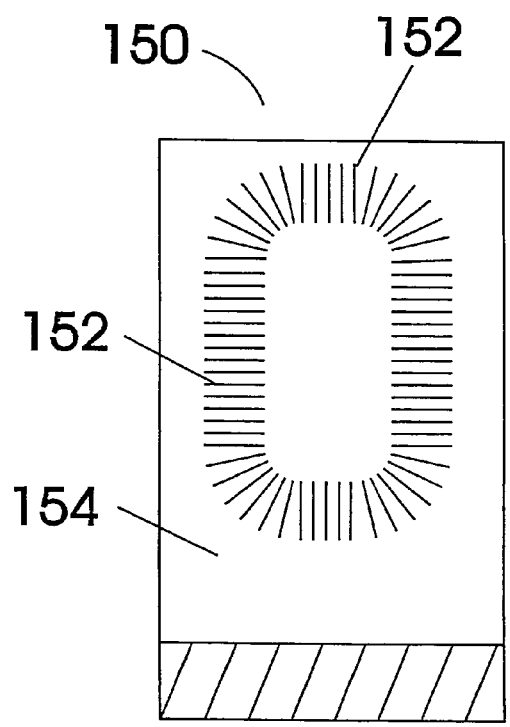
FIG. 5 is a view of an RF electric field shield that covers the entire area of the NMR probe coil winding.
Figure 6:
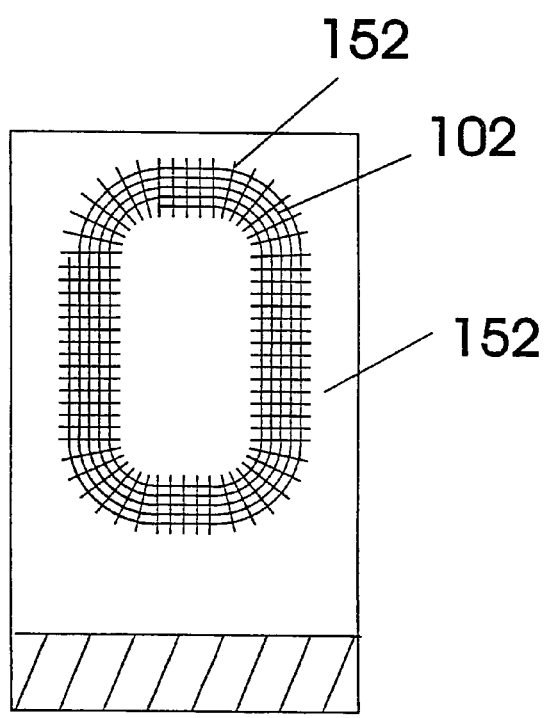
FIG. 6 is a view indicating the spatial relationship of the shield of FIG. 5 and the NMR probe coil winding.

In some cases, particularly with large samples and sample tubes, of comparable width as the windings 102 of FIG. 1, undesirable electric fields that penetrate the sample and sample tube may arise from the sides of the windings 102 as well as from the top and bottom. In these cases it is advantageous to provide an electric field full shield all the way around windings 102. FIG. 5 shows a full electric field shield assembly 160. This shield assembly consists of a series of HTS strips 162 that shield the entire coil windings, 102 of FIG. 1, from the sample and sample tube. These strips are oriented at right angles to the segment of the windings they cross, as illustrated in FIG. 6. The strips are mounted on a planar dielectric substrate 164. Shield assembly 160 can be mounted in probe 140 (FIG. 4) in different positions relative to its coil assembly 100 as described above with shield assembly 120. Alternatively the HTS strips 162 of the full shield assembly may be mounted on the same planar substrate 104 of FIG. 1, but on the opposite side from windings 102.

Figure 7:
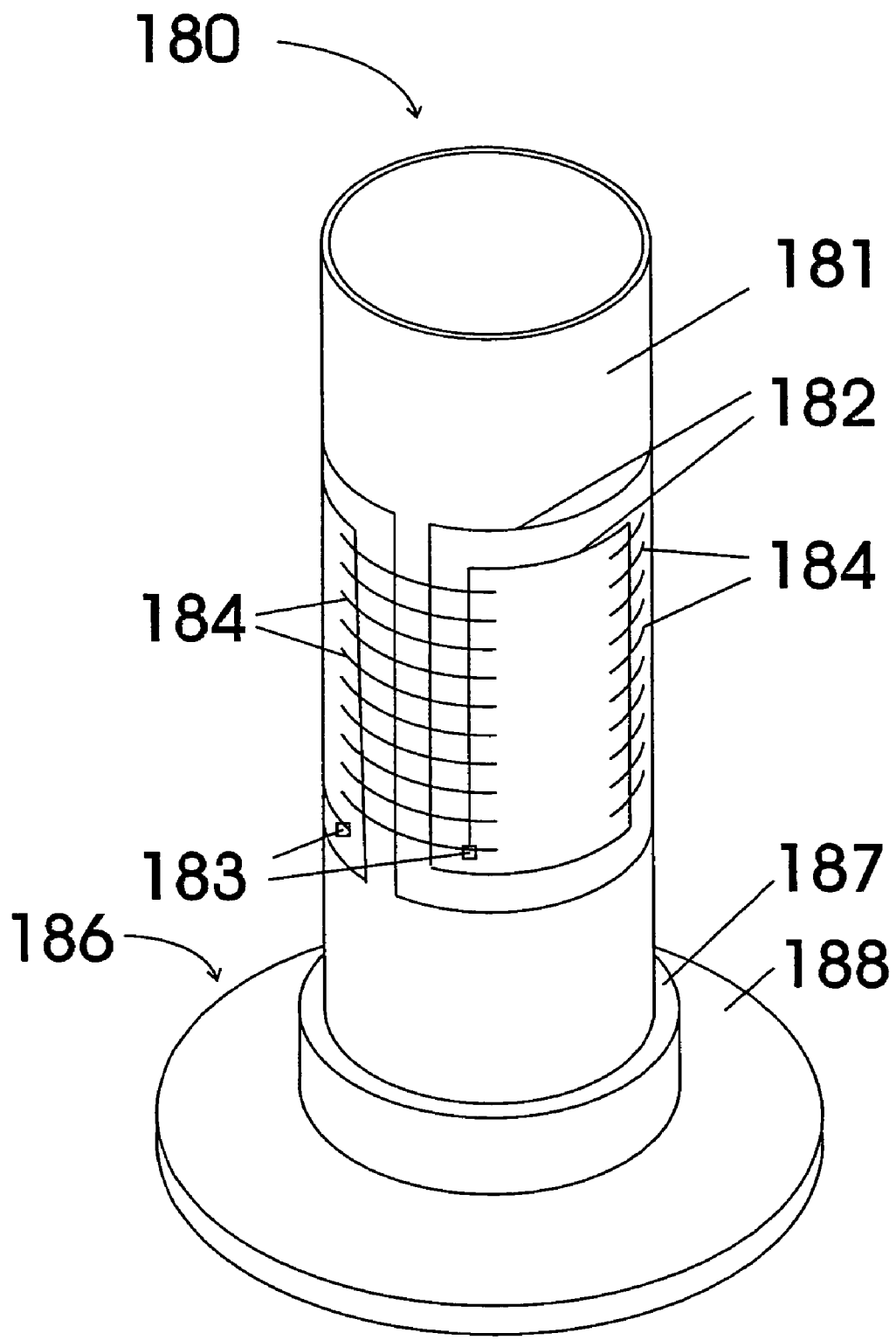
FIG. 7 is a perspective drawing of a cryogenic normal metal NMR probe coil with electric field shield strips.

FIG. 7 is a perspective drawing of a cryogenically cooled NMR probe coil assembly 180 with the saddle coil winding 182 mounted on a substrates that is in the form of a cylindrical tube 181. The saddle coil winding 182 is made either of wire or metal foil such as copper or aluminum or a clad metal foil as described in U.S. Pat. No. 6,411,092. The coil is electrically coupled to tuning and matching components (not shown) by wires connected to the coil bonding pads 183. The cylindrical tube 181 is made of a highly thermally conductive material such as sapphire and is mounted via bracket 186 to heat exchanger (143 of FIG. 4). Bracket 186 consists of a vertical member 187 that is thermally coupled to cylindrical tube 181 and horizontal member 188 that is thermally coupled to the heat exchanger (143 of FIG. 4). Electric field shield 184 is composed of short strips of wire or foil directed at right angles to the direction of the windings 182 that they cross. The shield overlaps the horizontal edges of the two sides of the saddle windings. Normally the saddle coil windings 182 are mounted on the outside of cylindrical tube 181 and the electric field shield 184 mounted on the inside diameter of the cylindrical tube 181. Alternatively the saddle coil winding 182 could be mounted on the inside of tube 181 and the electric field shield 184 mounted on the outside of the cylindrical tube 181.

It will be appreciated by those skilled in the art that a number of variations are possible within the spirit and scope of the invention. The scope of the invention should not be limited by the specific examples given above, but by the appended claims.

What is claimed is:

1. An NMR probe with a multiple windings RF coil patterned on a surface of a planar substrate and proximal to an NMR sample tube comprising:
    an RF electric field shield formed by a plurality of strips of electrically conductive material and placed on an opposite surface of the planar substrate or on another planar substrate adjacent thereto and positioned in a region adjacent to at least a pair of neighboring windings of the RF coil producing RF electric and magnetic fields,
    wherein a longitudinal axes of said strips is oriented in a direction substantially perpendicular to a direction of said at least a pair of neighboring windings.

2. The NMR probe of claim 1, wherein said RF electric shield is positioned between the RF coil and the NMR sample tube.

3. The NMR probe of claim 1, wherein the RF coil is positioned between said RF electric shield and the NMR sample tube.

4. The NMR probe of claim 1, wherein the windings of the RF coil and said RF electric field shield are made of HTS material.

5. A NMR probe, with a multiple windings RF coil proximal to an NMR sample tube comprising:
    an RF electric filed shield formed by a plurality of strips made of normal metals, fixed to an outside surface of cylindrical dielectric substrate and positioned in a region adjacent to at least a pair of neighboring windings of the RF coil producing RF electric and magnetic fields,
    wherein a longitudinal axes of said strips is oriented in a direction substantially perpendicular to a direction of said at least a pair of neighboring windings.

6. The NMR probe of claim 5, wherein the windings of the RF coil form saddle coils, which are mounted on an inside surface of said cylindrical dielectric substrate.

7. A nuclear magnetic resonance method of reducing the electric fields penetrating an NMR sample tube disposed within an NMR probe with a multiple windings RF coil patterned on one side of a first planar substrate, which is positioned in proximity to the NMR tube, comprising the steps of:
    forming an RF electric field shield by disposing a series of electrically conducting strips on an opposite side of the first planar substrate or second planar substrate placed adjacent to the first planar substrate in a region where at least a pair of neighboring windings of the RF coil producing electric field in proximity to the NMR sample tube, and orienting said strips in a direction perpendicular to a direction of said at least a pair of neighboring windings,
    wherein the electric field produced by said windings is guided along said RF electric shield away from the NMR sample tube; and
    orienting longitudinal axes of said strips in a direction, which is perpendicular to a direction of said at least a pair of neighboring windings of RF coil.

8. The nuclear magnetic resonance method of claim 7, further comprising: manufacturing said strips and the RF coil form HTS material.

9. The nuclear magnetic resonance method of claim 7, further comprising positioning said RF electric shield between the RF coil and the NMR sample tube.

10. The nuclear magnetic resonance method of claim 7, further comprising positioning the RF coil between said RF electric shield and the NMR sample tube.

\* \* \* \* \*